United States Patent [19]

Cachier et al.

[11] Patent Number: 5,175,597
[45] Date of Patent: Dec. 29, 1992

[54] SEMICONDUCTOR COMPONENT WITH SCHOTTKY JUNCTION FOR MICROWAVE AMPLIFICATION AND FAST LOGIC CIRCUITS

[75] Inventors: Gérard Cachier, Bures S/Yvette; Jacques Gremillet, Chevreuse, both of France

[73] Assignee: Thomson-CSF, Puteaux, France

[21] Appl. No.: 714,588

[22] Filed: Jun. 13, 1991

[30] Foreign Application Priority Data

Jun. 15, 1990 [FR] France .................. 90 07513

[51] Int. Cl.⁵ .......................... H01L 29/48
[52] U.S. Cl. ........................ 257/267; 257/284; 257/474; 257/477; 257/571
[58] Field of Search .............. 357/15, 55, 56, 22 E, 357/22 L, 22 F, 34, 22 I, 22 K

[56] References Cited

U.S. PATENT DOCUMENTS 4,510,016  4/1985  Chi et al. .................. 357/15 X

FOREIGN PATENT DOCUMENTS 0230840  8/1987  European Pat. Off. .

OTHER PUBLICATIONS

No Author, "Multiple Grid Permeable Base Transistor," *IBM Technical Disclosure Bulletin*, vol. 31, No. 5, Oct. '88, 40-3.

Rathman et al., "The Effect of Base-Schottky Geometry on Si PBT Device Performance", *IEEE Electron Device Letters*, EDL-5, Jun. 1984, No. 6, pp. 191-193.

Ohshima et al., "Self-Aligned NiSi₂ Electrode Fabrication by MBE and Its Application to Etched-Groove Permeable Base Transistor (PBT)", *Journal of Crystal Growth*, 95 (1989), pp. 490-493.

*Primary Examiner*—William Mintel
*Attorney, Agent, or Firm*—Oblon, Spivak, McClelland, Maier & Neustadt

[57] ABSTRACT

A semiconducting component with a Schottky junction with stacked electrodes has a lower electrode forming an emitter or source, a central electrode forming a base or grid and an upper electrode forming either a collector or a drain. Semiconductor material is between the upper electrode and the lower electrode. The central control electrode is in the form of several adjacent conducting fingers. An insulating material is in the region directly below the fingers between the control electrode and the lower electrode, thereby reducing parasitic capacitance between the control electrode and the lower electrode.

10 Claims, 5 Drawing Sheets

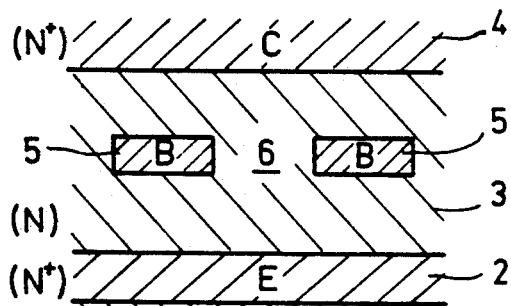
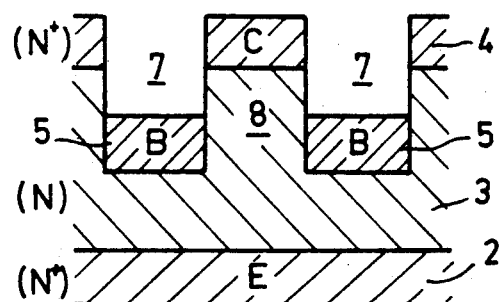
FIG.1  FIG.5
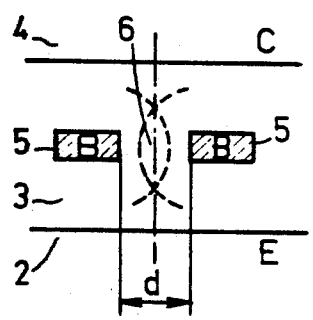
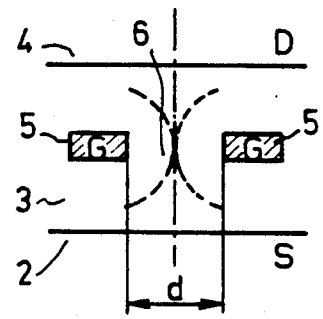
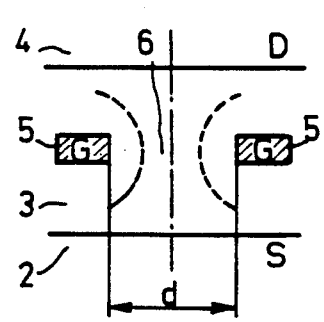
FIG.2  FIG.3  FIG.4
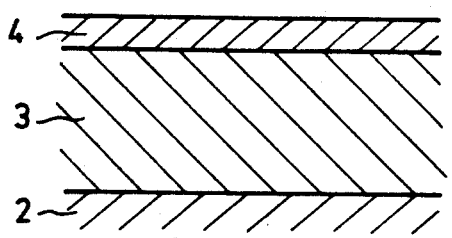
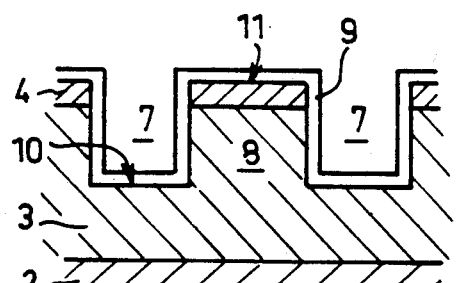
FIG.6  FIG.7
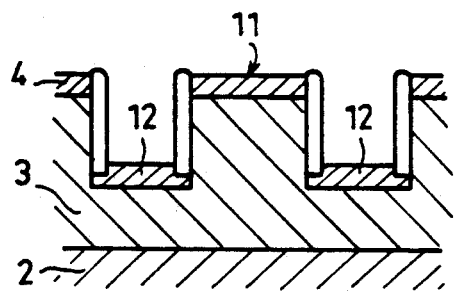
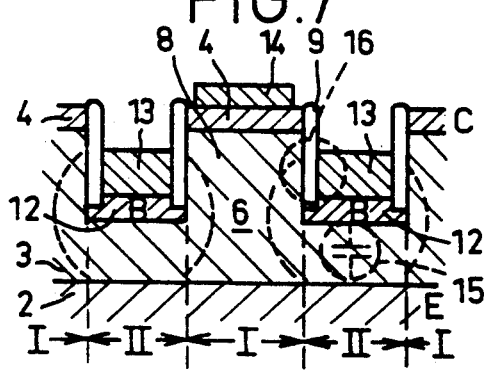
FIG.8  FIG.9

SEMICONDUCTOR COMPONENT WITH SCHOTTKY JUNCTION FOR MICROWAVE AMPLIFICATION AND FAST LOGIC CIRCUITS

BACKGROUND OF THE INVENTION

The present invention concerns a semiconductor component with a Schottky junction, intended for fast logic circuits and microwave amplification.

Numerous component structures have already been proposed for this purpose, among which we may cite bipolar homojunction transistors, bipolar heterojunction transistors, MESFET transistors (MEtal-Silicon Field-Effect Transistor), transistors of the type known as TEGFET (Two-dimension Electron Gas Field-Effect Transistor) or HEMT (High Electron Mobility Transistor), and so-called permeable-base transistors (whose structure will be specified later in the present description).

Generally speaking, at microwave frequencies, maximum amplification is desired, at the highest possible frequency and with the highest possible output power. These three factors (gain, frequency and power), however, are not independent of each other, which means that compromise and optimization are necessary.

To a first approximation, it can be said that the aptitude to amplify is limited in frequency by the series resistance R and the parallel capacitance C at the input (giving a time constant RC limiting the maximum input frequency) and by the transit time of charge carriers within the component, this transit time also being directly related to the power available at output.

With fast logic circuits, it can be said, again as a first approximation, that devices are needed with a high slope and low input and output capacitance to be able to work at high clock speeds.

The MESFET transistor, with its usual structure (i.e. a horizontal structure, where the three source, grid and drain electrodes are in the same plane), has a fairly favorable product RC inherent in this structure. However, owing to this structure, the transit time is relatively long. Moreover, the fact that the three electrodes are in the same plane does not facilitate the parallel installation of elementary transistors from the technological point of view—this is however necessary for powerful components.

In addition, if the input and output capacitances are relatively low, the mutual conductance is relatively high, which has a negative effect on the input product RC, and therefore on the maximum working frequency.

Finally, the MESFET is generally made on gallium arsenide, which considerably increases the complexity of manufacture as well as the cost.

To remedy these disadvantages, the structure known as the "permeable-base transistor" was proposed, illustrated in diagrammatic form in FIG. 1.

This structure is a vertical structure with stacked electrodes comprising, on a substrate 1, a strongly doped layer 2 (for example N+), then a weakly doped layer 3 (for example N), then another strongly doped layer 4 (for example N+). Within the layer 3 are buried, approximately at mid-height, a series of metallic electrodes 5 (for example in the form of a series of fingers) which are interconnected and linked to the same potential.

The different layers 2, 3, 4 are formed by epitaxy, typically on gallium arsenide. The material of which the buried electrode 5 is made is chosen so as to be compatible with this epitaxy (for example, tungsten is chosen for epitaxy on gallium arsenide).

Layer 2 constitutes an electrode known as the emitter electrode and layer 4 an electrode known as the collector electrode (or the reverse; throughout the present description, the two structures will be considered as equivalent); the electrode 5 constitutes an electrode known as the base electrode, defining a semiconducting channel 6 between the collector 4 and the emitter 2, whose conduction can be controlled by the polarization of this base 5, so that electrons can be selectively permitted to circulate or prevented from circulating between the collector and the emitter through the metal fingers of the base 5 (hence the term "permeable-base").

The general operation of such a permeable-base transistor is explained in FIG. 2.

Essentially, the polarization of the electrode 5 creates space charge zones, delimited by the dashed curve in FIG. 2, and whose overlapping at the semiconducting channel 6 creates a potential barrier to be crossed by the electrons wishing to circulate in this channel between the collector and the emitter. The component is thus controlled like a bipolar transistor, and this is why the electrodes 2, 5 and 4 are respectively called "emitter", "base" and "collector".

It will be noted that, if the distance d between the fingers of the electrode 5 was increased, the space charge zones would progressively become simply adjacent (medium d, FIG. 3), with therefore a null potential barrier for the electron, and then distant (large d, FIG. 4), thus opening the conducting channel 6.

In the first case (FIG. 3), the situation would be that of a vertical MESFET normally blocked, the electrodes 2, 5 and 4 corresponding respectively to the source, the grid and the drain. It is possible to make this MESFET conducting by polarizing the electrode 5.

In the second case (FIG. 4), the situation would be that of a normally conducting MESFET, which can be blocked by polarizing the electrode 5.

It can be seen that in both these cases, the control of the component would no longer be analogous to that of a bipolar transistor as in the case illustrated in FIG. 2, but would be that of a field-effect transistor.

It will nevertheless be noticed that, physically, the structure remains the same in all three cases, although the electronic behavior and therefore the mode of operation (permeable-base transistor or field-effect) is modified as a function of the distance d—large or small—between the electrodes 5.

As will be seen later, the present invention will cover all the possible modes of operation of such a structure; for this reason, to avoid any restrictive terminology, we shall in the rest of the present description call the electrode 5 (which is a base or a grid, depending on circumstances) the "control electrode", the electrode 2 (emitter or source) the "lower electrode" and the electrode 4 (collector or drain) the "upper electrode".

It should also be noted that it would be perfectly possible to invert the roles of the electrodes 2 and 4, the electrode 2 then being the collector (or drain) and the electrode 4 the emitter (or source). The invention will consider both these possibilities equally, and the terminology "lower electrode" and "upper electrode" has been chosen in particular because it does not imply a preconception of the respective electrical roles of these two electrodes 2 and 4.

Another known transistor structure, electrically equivalent to that in FIG. 1, has been represented in FIG. 5.

In this structure, the base electrode 5 is no longer a buried electrode, but an electrode deposited at the bottom of a groove 7, the different grooves 7 delimiting fingers 8 in the semiconducting material, defining between the base electrodes 5 channels whose conduction will be controlled by the polarization of these base electrodes.

A first advantage of this structure is to be able to use for the base 5 a material independent of the epitaxy, and in addition to be able to increase the thickness of this base for example by adding metal, thus enabling its resistance, and therefore the input resistance of the component, to be reduced.

On the other hand, unlike the structure in FIG. 1, this structure is generally made not on GaAs but on silicon. It is an extremely delicate task to make grooves in GaAs, while this can be done without difficulty in silicon (technique commonly used for manufacturing DRAM memories). Moreover, it is difficult to control the surface state of the sides of grooves in GaAs, whose surface irregularities provoke the development of parasitic space charge zones. The surface state of silicon, on the other hand, is easily controlled, for example by appropriate passivation of the sides of the groove.

The manufacturing process of such a component on silicon is diagrammatically illustrated in FIGS. 6 to 9.

According to this process, after having formed the different layers 2, 3 and 4 by epitaxy with the appropriate dopings (FIG. 6), the grooves 7 are etched (FIG. 7) to leave semiconducting fingers 8 and the whole is covered with a passivation layer 9, for example of silicon dioxide or silicon nitride.

This passivation layer 9 is then directionally etched, so as to lay bare the bottoms 10 of the grooves 7 and the tops 11 of the semiconducting fingers, leaving however the passivation layer on the sides of the grooves.

A metallic deposit 12 is then formed at the bottom of the grooves (FIG. 8) enabling a Schottky junction to be constituted by the formation of a silicide of the metal.

An enrichment layer 13 of the metallic deposit 12 which will constitute the base of the component is then deposited (FIG. 9), so as to increase the thickness of the base and reduce the corresponding electrode resistance (and therefore the component's input RC). A metallization 14 is also deposited at the top of the semiconducting fingers 8, enabling connection to the layer 4 constituting the collector electrode.

This structure, although relatively easy to make on silicon, presents a number of disadvantages.

First, it will be noticed that the structure is composed essentially of a juxtaposition of useful regions (referenced I in FIG. 9), i.e. regions where the electrons circulate (channel 6, defined in the region of the semiconducting fingers 8, whose conduction is controlled by the polarization of the base electrodes 12) and parasitic regions, referenced II in FIG. 9, which are the regions situated directly under the base electrodes 12; these regions are of no use from the electronic point of view, since the controlled conduction occurs between the electrodes 12 and not below them.

These zones II are in fact doubly parasitic.

First, the zone referenced 15, i.e. the zone under the base 12, between the latter and the emitter 2, introduces a parasitic capacitance which deteriorates the input product RC and thus correspondingly limits the maximum working frequency of the component.

Secondly, the zone referenced 16, i.e. the zone between the side of the groove and the metallic enrichment deposit 13, can introduce a parasitic control applied to the component, the successive layers of metallization 13, passivation 9 and semiconductor of the region 8 then behaving as a structure of type MIS (Metal-Insulator-Silicon) or MOS (if the passivation insulator is an oxide) likely to trigger the component at the wrong moment.

This zone 16, in addition to the possibility of parasitic control, introduces a base/collector capacitance between the metallization 13 and the upper semiconducting layer 4. This capacitance, although reduced compared with the buried-base structure (shown in FIG. 1), remains relatively large.

SUMMARY OF THE INVENTION

The aim of the present invention is to remedy all the abovementioned disadvantages, by proposing a component which overcomes the limitations just described of the components of the prior art, notably of permeable-base transistors.

A first objective of the invention is to minimize the component's input capacitance by reducing to a large degree the parasitic capacitance between the base and the emitter, which would enable a much higher working frequency to be obtained (for, as we shall see, the low input resistance provided by the increase in the metal of the base is preserved).

A second objective of the present invention is to find a solution to the risk of parasitic control by MIS effect encountered with these components, i.e. the risk of unwanted control of the component by the sides of the grooves.

A third objective of the invention is to propose a structure which would in addition enable several elementary components formed on the same substrate to be interconnected, by providing impedance pre-adaptation circuits, made directly on this substrate, to optimize the global input and/or output impedance of the various elementary components thus combined.

A fourth objective of the invention is to propose a structure which would in addition enable easy integration into the component of an additional electrode to counteract the Miller effect (the Miller effect is a classic effect encountered in all amplifier stages using electronic tubes or field-effect transistors, by which the feedback capacitance is fed to the input multiplied by a factor $g+1$, g being the gain of the amplifier stage; the result of this effect is therefore to increase the input capacitance considerably if it is not compensated or neutralized.

A fifth objective of the invention is to propose a structure which can be made either directly on a semiconducting substrate (typically, using mesa-type technology), or on a high-resistivity substrate, access to the internal lower electrode then being gained by vias, this technology already being well-known.

A sixth objective of the invention is to propose a component whose mode of operation may be both as a permeable-base transistor (as explained above with reference to FIG. 2) and as a vertical MESFET transistor (as explained above with reference to FIGS. 3 and 4), even with the possibility of mixed operation, i.e. operation as a permeable-base transistor for part of the cycle and as a MESFET for the rest of the cycle. It will thus be possible to combine in the best possible way, depending on the requirements and the point of operation, the advantages of the permeable-base transistor (excellent mutual conductance, excellent gain and frequency characteristics) and those of the MESFET (input impedance higher, therefore easier to adapt, and higher intensities possible, therefore better power endurance).

A seventh objective of the invention, finally, is to enable (if so wished) the realization of such a component on silicon, therefore using simple techniques, while obtaining a performance which is as good as, if not better than that of present components of the same type made on GaAs. Moreover, in addition to the technology which is simpler to use, silicon has the advantage that its thermal conductivity is excellent (three to four times better than III–V materials such as GaAs), so that, for the same dissipated power, the operating temperature will be considerably lower, thus enabling the reliability of the component to be increased (or, inversely, for the same operating temperature much more power can be dissipated); this latter advantage is all the more useful since, as we shall see, the component of the invention is particularly well-suited to the construction of microwave power components.

For this purpose, the present invention proposes a semiconductor component with a Schottky junction of the general type corresponding to the structure illustrated in FIG. 5, i.e. a structure with stacked electrodes comprising, successively: a lower electrode, forming either emitter or source, or collector or drain; a central control electrode, forming a base or grid; and a lower electrode, forming respectively either collector or drain, or emitter or source; a semiconducting material being placed between the upper electrode and the lower electrode, and the control electrode being configured within this material in several adjacent conducting fingers defining, in the transversal space separating them, at least one semiconducting channel extending vertically between the upper electrode and the lower electrode and whose conduction is controlled by the polarization of the control electrode.

According to the invention, the region situated directly below the fingers, between the control electrode and the lower electrode, comprises an insulating material, so that the parasitic capacitance between the control electrode and the lower electrode is reduced.

The insulating material between the control electrode and the lower electrode can notably be a material of the group comprising the polyimides, silicon oxide, silicon nitride and silicon oxynitride.

According to another particularly advantageous characteristic of the invention, the fingers of the control electrode each being formed by a conducting deposit at the bottom of a groove etched in the said semiconducting material. The sides of this groove being covered with a layer of passivation material, a region with a low dielectric constant is placed between the said sides of the grooves and the sides of the said conducting deposit, in order to prevent any parasitic control of the component by the groove sides; this region with a low dielectric constant can notably be constituted of a transverse region with no material.

An additional electrode forming a screen can also be advantageously placed between the control electrode and the upper or lower electrode, in order to reduce the Miller effect.

The said semiconducting material is preferably a weakly doped silicon, the upper and lower electrodes being of strongly doped silicon of the same type of conductivity as the silicon of the semiconducting material.

In a first form of embodiment, the lower electrode can then be constituted by the substrate itself of the component.

In a second form of embodiment, the lower electrode can on the other hand be formed by a layer epitaxied on a substrate of quasi-intrinsic silicon of high resistivity, means then being provided to ensure contact to the lower electrode through this substrate of high resistivity.

The component obtained in this way can notably be interconnected to other similar components.

It is then very advantageous to provide input impedance pre-adaptation circuits, formed by a combination of inductive sections and capacitive sections of the conductors forming links to the various conducting fingers constituting the control electrode of the component, and if applicable, a combination of inductive sections and capacitive sections of the conductors interconnecting the control electrodes of other components realized on the same substrate, so as to compensate for the modification of impedance resulting from the placing in parallel of the different conducting fingers of the same component and/or from the placing in parallel of several components realized on the same substrate.

Furthermore, the output impedance pre-adaptation circuits can be formed in the same way, by combining inductive sections and capacitive sections of the conductors forming links to the different conducting zones constituting the upper electrode of the component and, if applicable, combining inductive sections and capacitive sections of the conductors interconnecting the upper electrodes of other components made on the same substrate, so as to compensate for the modification of impedance resulting from the placing in parallel of the different conducting zones of the same component and/or from the placing in parallel of several components made on the same substrate.

The present invention also proposes a process for manufacture of a component according to any one of the above features comprising the stages of:

(a) forming on a substrate a structure in superposition comprising successively a lower electrode, a layer of semiconducting material and an upper electrode, (b) etching in this structure grooves of a depth such that they at least partially enter the thickness of the lower electrode, (c) filling the grooves formed in this way with an insulating material, (d) partially eliminating the insulating material thus deposited down to a groove depth situated at a median level of the layer of semiconducting material, (e) depositing in the groove, on the visible zone of the insulating material at the said median level, a metallization forming a control electrode, and (f) passivating the sides of the groove above the metallization thus deposited.

To reduce the resistance of the control electrode and therefore the input resistance of the component, the stage (f) above may notably comprise steps consisting in:

(f1) depositing, on the sides and bottom of the groove, at least one layer of passivation material, (f2) selectively etching the horizontal zones of this layer of passivation material, so as to leave the underlying metallization visible at the bottom of the groove, (f3) depositing on this visible metallization a layer of metallic enrichment material.

Very advantageously, to eliminate the risks of parasitic MIS control of the component by the sides of the during stage (f1), a first passivation material and then a second passivation material different from the first are deposited in succession, and after stage (f3), a stage (f4) consists in eliminating the second passivation material so as to leave, between the sides of the groove and the sides of the said metallic enrichment material, a space with no material.

The insulating material mentioned above is preferably a material of the group comprising the polyimides, silicon oxide, silicon nitride and silicon oxynitride.

If it is wished to make a tetrode structure enabling the Miller effect of the component to be reduced, additional stages are performed after stage (f), consisting in:

(g) filling the grooves again with an insulating material, (h) partially eliminating the insulating material thus deposited to a depth situated at a level intermediate between the said median level of the layer of semiconducting material and the level of the upper electrode, (i) depositing in the groove, on the visible region of the insulating material at the said intermediate level, a second metallization forming a screen electrode.

If the process of the invention is to be used to manufacture the first form of embodiment described above, the said structure is then a structure formed by silicon epitaxy, the said semiconducting material being slightly doped and the upper and lower electrodes being strongly doped and of the same type of conductivity as the semiconducting material, and the lower electrode is constituted by the component substrate itself.

If the process of the invention is to be used to manufacture the second form of embodiment described above, the said structure is then a structure formed by epitaxy of silicon on a quasi-intrinsic silicon substrate with high resistivity, the said semiconducting material being slightly doped, and the upper and lower electrodes being strongly doped and of the same type of conductivity as the semiconducting material.

In this case, to form the connection to the lower electrode, phases should also be included consisting in forming via holes on the back of the substrate to a depth enabling the lower electrode to be reached and depositing in these vias a metallization enabling a connection to be made to this electrode.

If the abovementioned input impedance pre-adaptation circuits are to be made by the process of the invention, a phase of selective etching of the metallizations forming the control electrodes should also be included, so as to form a combination of inductive sections and capacitive sections of the conductors interconnecting the control electrodes of other components on the same substrate.

If, in the same way, it is also wished to manufacture the abovementioned output impedance pre-adaptation circuits by the process of the invention, a phase of selective etching of the metallizations forming the upper electrodes, in such a way as to form a combination of inductive sections and capacitive sections of the conductors linking these upper electrodes as well as, if necessary, a combination of inductive sections and capacitive sections of the conductors interconnecting the upper electrodes of other components on the same substrate.

BRIEF DESCRIPTION OF THE DRAWINGS

Examples of realization of the component of the invention, and application of its manufacturing process, will now with given with reference to the appended drawings:

FIG. 1, mentioned earlier, illustrates in diagrammatic form the basic structure of a permeable-base transistor of prior art.

FIGS. 2 to 4, mentioned earlier, illustrate the various modes of operation possible for the component illustrated in FIG. 1, as a function of the width of the intervals defined between the metallic parts of the base.

FIG. 5, mentioned earlier, represents a variant, still according to the prior art, of the component shown in FIG. 1 in which, instead of burying the bases, they are formed at the bottom of grooves.

FIGS. 6 to 9, mentioned earlier, illustrate the various phases of the manufacturing process of the component in FIG. 5.

DESCRIPTION OF THE PREFERRED EMBODIMENTS

Figure 19:
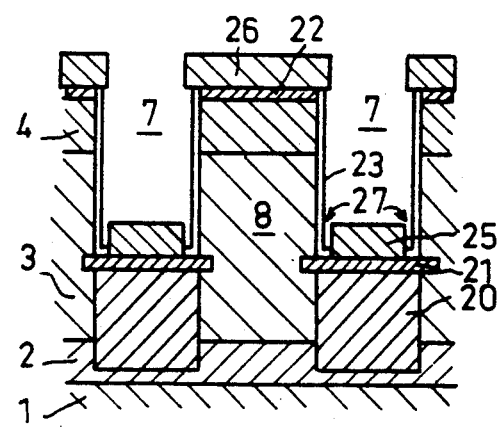
Figure 20:
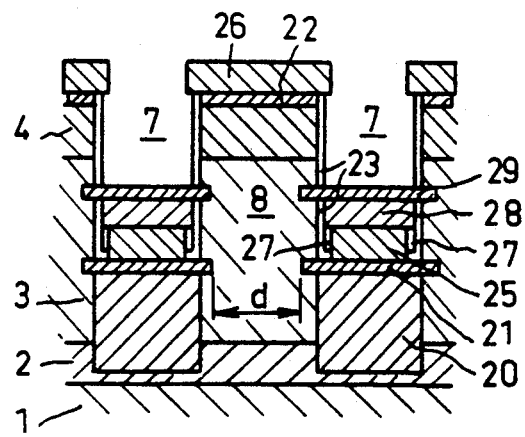
Figure 21:
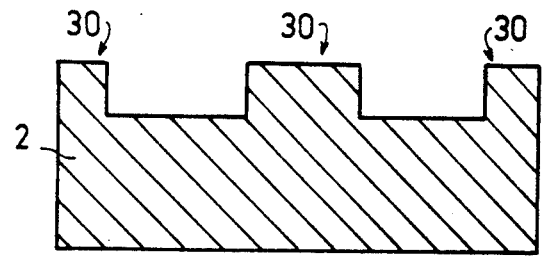
FIGS. 21 to 28 illustrate the various successive stages of a manufacturing process of a set of elementary components formed on the same substrate.
Figure 22:
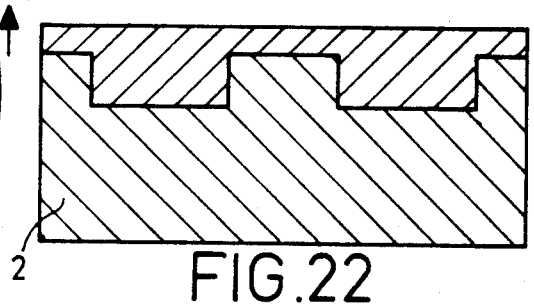

FIGS. 10 to 20 illustrate the different stages of manufacture of a component according to the invention, the final component obtained, integrating all the characteristics proposed by the invention, being represented in FIG. 20.

We shall first describe the manufacturing process of this component, whose characteristics will be described afterwards with reference to FIG. 20.

First of all (FIG. 10), on a substrate 1 is formed a superposition of layers 2, 3, 4, in a conventional way, typically by epitaxy of silicon (this method not however being restricted to silicon).

The sequence of the layers 2, 3, 4, is typically a sequence $N^+$, $N$, $N^+$, as in the permeable-base transistors of the prior art. A sequence $P^+$, $P$, $P^+$, however, would be equally possible, all the other steps being the same; a transistor would thus be obtained of type complementary to that described.

It will be noted that the central layer N is not necessarily homogeneous; it may notably have variable doping, between the two $N^+$ layers.

It will also be noted that the substrate 1 may be either constituted by the layer $N^+$ itself (the two layers 1 and 2 are then combined), thus enabling direct contact with the lower electrode formed by the layer 2, or a highly resistive substrate (resistivity greater than 2000 $\neq$.cm)

such as a substrate of quasi-intrinsic silicon; in this case, the layer 2 of the lower electrode is a buried layer, and it will be necessary to make a contact by a via passing through the substrate filled with a conducting material, as will be described later with respect to FIG. 29.

The grooves 7 are then etched (FIG. 11), leaving between them semiconducting fingers 8.

The etching is performed by conventional processes, for example reactive ion etching.

Figure 10:
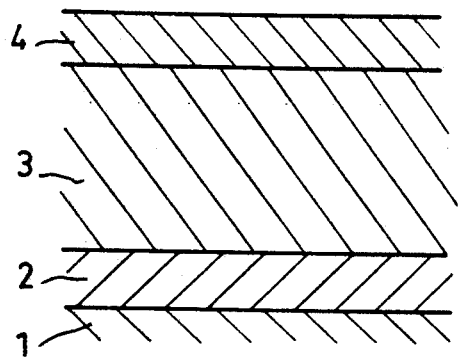
FIGS. 10 to 20 illustrate the various successive stages of a manufacturing process of an elementary component according to the invention.
Figure 11:
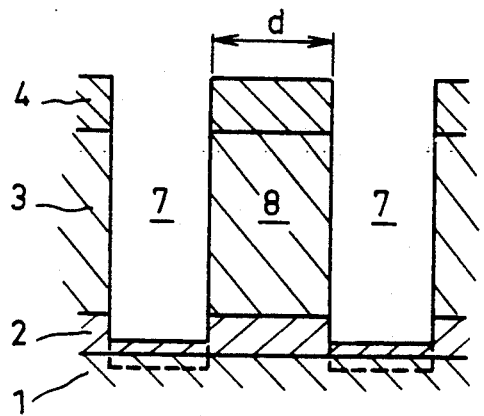

It is a characteristic of the invention that the etching of the grooves is made deeper than the level later intended for the Schottky junction (compare FIG. 11 with FIG. 7, corresponding to the technique of the prior art). The etching thus reaches the lower layer 2, as shown in FIG. 11, and can even go as far as the substrate or indeed penetrate it (as suggested in dashed lines in FIG. 11).

The width of the grooves 7 may be different from that of the fingers 8, in particular greater; it will be seen below how the width d of the semiconducting finger affects the mode of operation of the final component obtained.

The grooves are then filled in (FIG. 12) by an insulator 20. This insulator may be a silicon oxide, a silicon nitride or a polyimide, deposited by a known process, for example vapor phase deposition which may or may not be assisted by plasma.

Partial elimination of this insulator 20 is then carried out (FIG. 13) to the level intended for the Schottky junction. As can be seen, the walls of the semiconducting fingers 8 are thus laid bare in the whole of the region where the insulator has been eliminated.

A fine metallic layer, 20 to 50 nm thick, is then deposited (FIG. 14), defining the emplacement of the Schottky junction which will be made during the next phase, and also defining, as shall be seen below, the interconnections for placing in parallel the different control electrodes of a single elementary component and, if applicable, the different elementary transistors formed on the same substrate.

The metal can for example be tungsten, cobalt or platinum.

In addition to the deposit 21 at the bottom of the grooves, the metal is also deposited (reference 22) at the top of the semiconducting fingers in order to enable later contact to the upper electrode defined by the layer 4 (and, in the same way, interconnection of the different upper electrodes).

Then, (FIG. 15), after surface cleaning of the sides of the grooves, the Schottky junction is made by formation of a silicide of the metal deposited at 21 during the previous stage.

It can be seen that at this stage the capacitance on each side of the metallization of the control electrode 21 has already been reduced, both above this electrode, since grooves are used instead of the buried electrode (in known manner, as in FIG. 5), and also—in a way characteristic of the invention—below this electrode, since the capacitance under the metallization 21 is no longer that of a junction (as in the prior art, as illustrated in FIG. 5), but that resulting from the presence of the dielectric constituted by the insulator 20, i.e. at least three times less.

After this stage vapor-phase chemical deposition (FIG. 16) is performed, which may be plasma-assisted, of two successive passivation layers 23 and 24 of different insulators, for example silicon oxide and then silicon nitride, or vice versa.

The flat horizontal zones are then etched (FIG. 17), for example by reactive ion etching, so as to leave the two passivation layers 23 and 24 only on the sides of the grooves, laying bare the metallizations 21 and 22.

These metallizations 21 and 22 are then enriched (FIG. 18) by respective metallic deposits 25 and 26, for example of aluminium and/or gold. The second insulating layer 24 is then eliminated (FIG. 19) by selective chemical etching, so as to leave only the first passivation layer 23.

This procedure makes it possible to leave between the sides of the metallization 25 of the control electrode and the sides of the grooves, a space 27 enabling the risks of MIS parasitic control to be considerably reduced. The dielectric constant of this space 27 is $\epsilon_o = 1$, this value being much lower than the dielectric constant $\epsilon \leq 4$ of the passivation materials usually used such as silicon oxide or silicon nitride.

The passivation of the sides of the grooves is nonetheless still ensured by the first remaining layer 23.

The component thus constructed, illustrated in FIG. 19, can be used as it is but a second Schottky junction can advantageously be formed, as illustrated in FIG. 20, above the first one using the same process.

For this purpose, a second insulating layer 28 is deposited above the metallization 25 and a second Schottky junction is formed (deposit of a fine metal layer then formation of a silicide of this metal) in the same way as for the Schottky junction 21.

The electrode 29 thus obtained, suitably polarized, can constitute an electrostatic screen, interposed between the control electrode 21, 25 and the upper electrode 22, 26, reducing the capacitance between these two electrodes. If the component is used for amplification, the Miller effect mentioned above, which usually appears with components of this type, can thus be very strongly limited.

In other words, this screen enables the triode structure to be transformed into a tetrode structure.

It will be noted that the two electrodes (control electrode and screen electrode) can exchange functions depending on the position of the reference electrode (collector), which, as we indicated at the beginning of the present description, may be either at the substrate (lower layer 2) or at the top of the fingers (upper layer 4).

Moreover, during the design of the component, the doping and the width d of the semiconducting channel will be chosen as a function of the component's desired mode of operation.

More precisely, for a given doping n, when the width d of the channel defined by the width of the semiconducting finger 8 is made to vary, we pass in a continuous way from permeable-base transistor operation (very narrow finger) to vertical MESFET operation (wider finger), the transition between the two modes taking place at approximate values of n and d such that:

$$n \cdot d^2 = (8\epsilon/q)\phi,$$

where $\epsilon$ is the dielectric constant of the semiconductor, q the charge of the electron ($1.6 \, 10^{-19}$ C) and $\phi$ the contact potential of the Schottky junction.

In order to optimize the technological problems (width of fingers) and the circuit problems (input and output impedances, ...), values of n and d could be used close to those defined by the equation given above, thus creating a transistor which would be strictly speaking neither a permeable-base transistor nor a MESFET, since it would behave as a MESFET for zero polarization of the control electrode with respect to the reference electrode (lower electrode) and as a permeable-base transistor for polarizations close to the transistor blockage point.

Moreover, as explained above, an important advantage of the structure is to be able to be created and to function using silicon as a semiconductor. However, unlike gallium arsenide, this does not offer a semi-insulating substrate.

Therefore, in order to be able to make contacts and to provide the interconnection and pre-adaptation circuits (see below) of the control electrode, the component can be made using "mesa"-type structures for the elementary components and deposits of insulator in fairly thick layers (several microns to several tens of microns) around the mesas to solve this problem.

This technique corresponds to the steps in the process illustrated in FIGS. 21 to 28.

On a semiconductor wafer is etched a set of small blocks 30 in which will be formed one or more elementary components. The depth of the etching may be between a few microns and a few tens of microns.

The etching is then filled in (FIG. 22) by an insulator, for example silicon dioxide.

Figure 24:
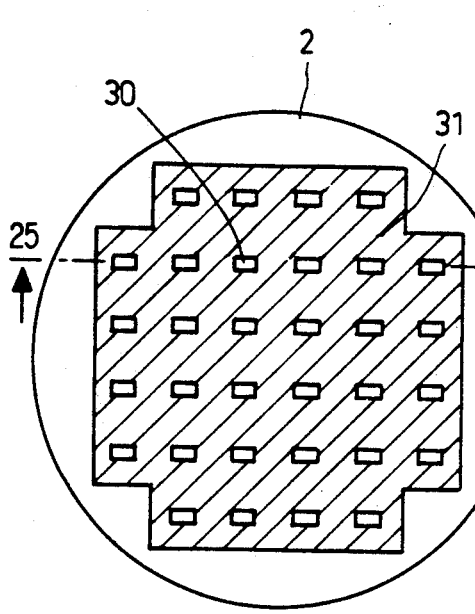

The semiconductor is then laid bare at the surface (FIG. 23), for example by mechanical and chemical polishing, which causes the blocks 30 to reappear, isolated from each other by the insulating mass 31. FIG. 24 shows the wafer in plan view, while FIG. 23 corresponds to a section along line A—A.

Figure 23:
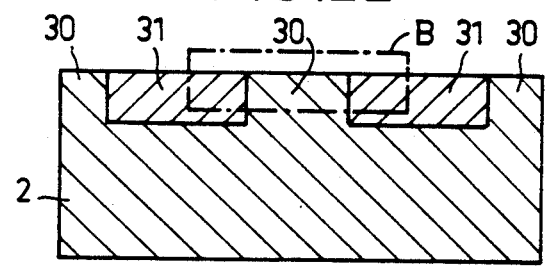

The various stages described above for FIGS. 10 to 20 are then carried out on each of the blocks 30, which have been represented in magnified form in FIGS. 25 to 28 (this magnification corresponding to the region referenced B in FIG. 23).

Figure 25:
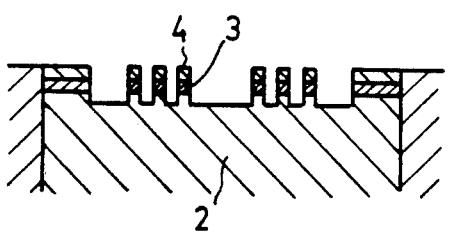

A section view of a block after etching of the fingers has thus been represented in FIG. 25. The block is here assumed to comprise two elementary transistors of three fingers each (these elementary transistors being placed in parallel to give the final complete transistor). The stage illustrated in FIG. 25 corresponds to the stage in FIG. 11, described in more detail above.

Figure 12:
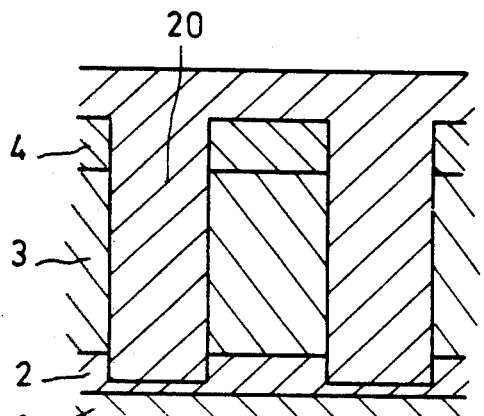
Figure 13:
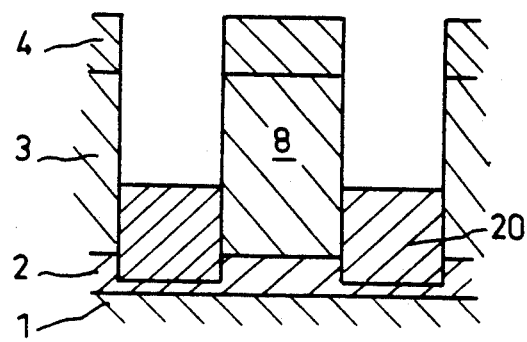
Figure 14:
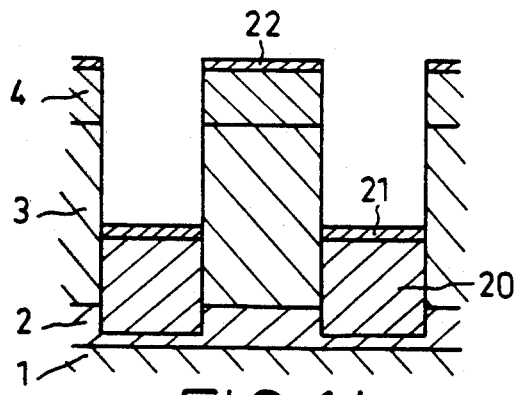
Figure 15:
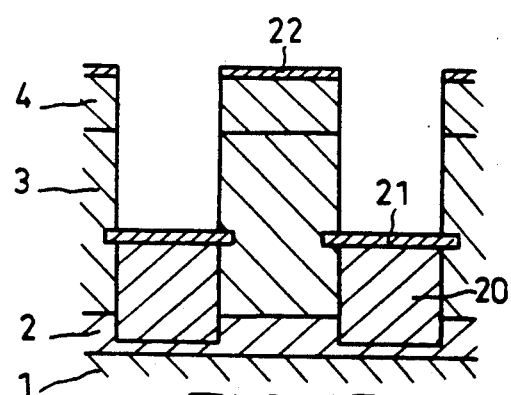
Figure 16:
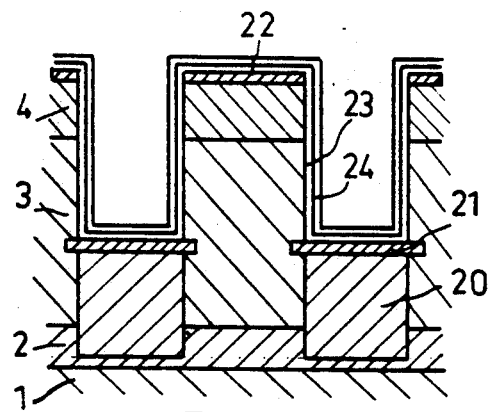
Figure 26:
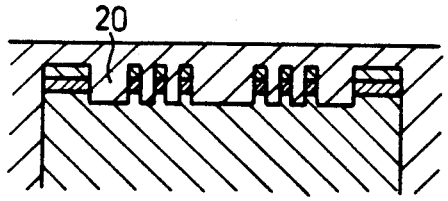
Figure 27:
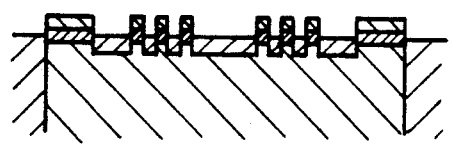

FIGS. 26 (filling in of etching by insulating material) and 27 (levelling of this insulator) correspond respectively to the stages of FIGS. 12 and 13 described above, and will therefore not be described in greater detail.

Figure 17:
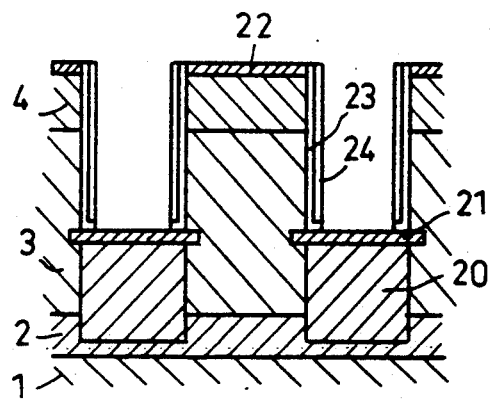
Figure 18:
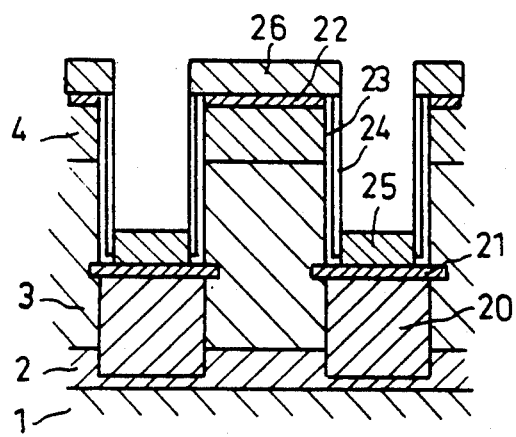
Figure 28:
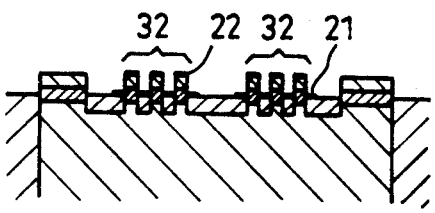

FIG. 28 corresponds to the stage of the process after deposition of the metallizations at the bottom of the grooves 21 and at the top of the fingers 22 (FIG. 17 described above).

The different metallizations 21 and 22 are configured in such a way as to ensure the placing in parallel of all the control electrodes (and, in the same way, of all the upper electrodes) of the same elementary component, referenced 32 in FIG. 28. It will also be seen that these metallizations can in addition, by a particular configuration, provide not only interconnection but also the pre-adaptation of the impedance, both at input and at output (see below the explanations with reference to FIG. 30) of the final component constituted of the different elementary components interconnected on the same substrate.

In another form of application of the process of the invention, to compensate for the fact that (unlike gallium arsenide) silicon does not provide a semi-insulating substrate, quasi-intrinsic silicon can be used for the substrate (resistivity of 2000 to 10 000 $\Omega \cdot cm$).

Figure 29:
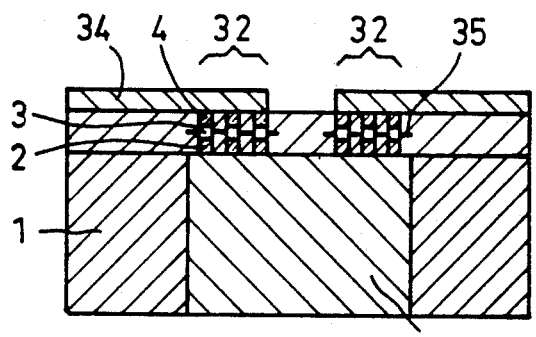
FIG. 29 illustrates a variant of the previous process, in which the components are made on a high-resistivity substrate instead of on a semiconducting substrate.

This is illustrated in FIG. 29, which is a section view of the substrate bearing two elementary transistors made using this technique.

It can be seen in this figure that access to the lower semiconducting layer 2 is provided collectively for all the components by a via 33 crossing the whole thickness of the quasi-intrinsic silicon substrate.

The upper electrodes (layer 4) of the different individual components are joined together by a metallization 34 ensuring the placing in parallel of the different elementary components.

Figure 30:
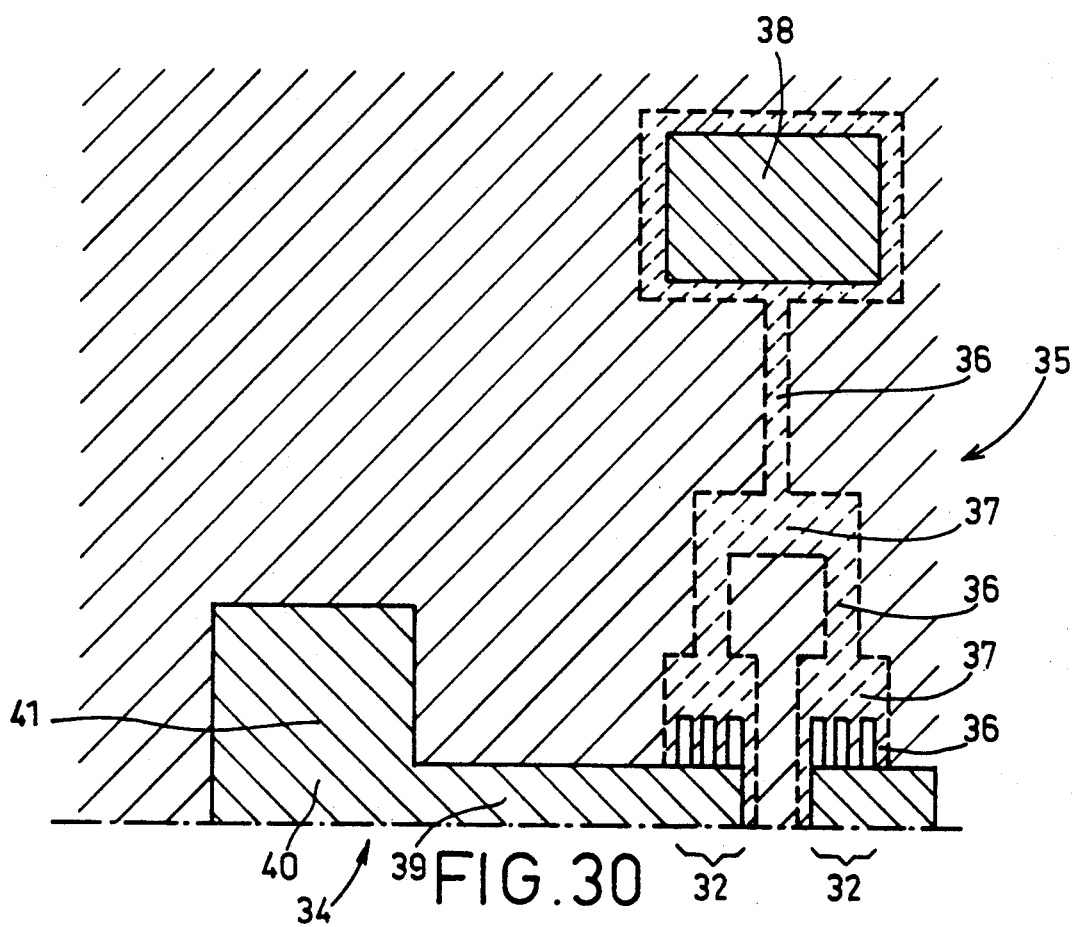
FIG. 30 shows the way in which several elementary components on the same substrate are interconnected, providing in addition the pre adaptation of the input and output impedance using inductive and capacitive parts integrated into the substrate during the manufacturing process.

Seen from above, the different electrical connections between electrodes are illustrated in FIG. 30 where we can see, in addition to the interconnection circuits themselves, impedance pre-adaptation circuits directly integrated during the various stages of construction of the component.

The placing in parallel of several elementary components, if performed with no particular precautions, would result in a considerable decrease in impedance: for example, the placing in parallel of ten components each with a unit impedance of $10\Omega$ would give a total impedance of $1\Omega$, much lower than the usual typical values for microwaves (25 to $70\Omega$).

It will be noted that, in this figure, the interconnection of only two elementary transistors 32 has been represented, but that this technique can be generalized to a larger number (ten, or even several tens) of elementary components, depending on the output power required.

For this purpose, the metallization 35 which interconnects the different control electrodes of the elementary components 32 is configured in a succession of long narrow parts 36 and short wide parts 37 which constitute respectively, from the electrical point of view, inductive parts and capacitive parts.

The line constituted of these inductive and capacitive parts 36, 37, whose values have been suitable calculated as a function of the number of components to be coupled in parallel and the global characteristic impedance required, enables an impedance of value compatible with the input circuits used to be fed to the collective contact 38.

In the same way, it is possible to form a pre-adaptation of the output impedance by appropriate configuration of the metallization 34 which serves to place in parallel the upper electrodes of the different elementary components, this metallization then comprising inductive parts such as 39 and capacitive parts such as 40 for the connection of the corresponding common contact 41 to the homologous electrodes of the various elementary components.

What is claimed is:

1. A semiconductor component with a Schottky junction with stacked electrodes formed on a substrate, comprising successively:
   a lower electrode,
   a central control electrode, and
   an upper electrode; and
   a semiconducting material between the upper electrode and the lower electrode, and the control electrode being configured within this material in the form of several adjacent conducting fingers defining, in the transverse interval separating them, at least one semiconducting channel stretching vertically between the upper electrode and the lower electrode whose conduction is controlled by the polarization of the control electrode, wherein the region situated directly below the fingers, between the control electrode and the lower electrode, comprises an insulating impermeable material.

2. The semiconductor component of claim 1, wherein the insulating material present between the control electrode and the lower electrode is a material of the group comprising the polyimides, silicon oxide, silicon nitride and silicon oxynitride.

3. The semiconductor component of claim 1, wherein the fingers of the control electrode each comprises a conducting deposit at the bottom of a respective groove etched in the said semiconducting material and sides this grooves being covered by a layer of passivation material, an interval with a low dielectric constant is provided between the side of the groove and the sides of the conducting deposit, so as to prevent any parasitic control of the component by the sides of the groove.

4. The semiconductor component of claim 3, wherein the interval with a low dielectric constant is constituted of a transverse region with no material.

5. The semiconductor component of claim 1, wherein an additional electrode forming a screen is provided between the control electrode and one of the upper and the lower electrode, in order to reduce the Miller effect on an amplifying stage constituted by the component.

6. The semiconductor component of claim 1, wherein the semiconducting material is more weakly doped silicon and the same conductivity type as silicon of the upper and lower electrodes.

7. The semiconductor component of claim 6, wherein the lower electrode is constituted by the substrate of the component itself.

8. The semiconductor component of claim 1, wherein the lower electrode is formed by a layer epitaxied on a substrate of quasi-intrinsic silicon of high resistivity, further comprising means for contacting with the lower electrode through this substrate of high resistivity.

9. The semiconductor component of claim 1, further comprising circuits for pre-adaptation of the input impedance, formed by a combination of inductive sections and capacitive sections of conductors connecting the different conducing fingers constituting the control electrode as well as a combination of inductive sections and capacative sections of conductors interconnecting control electrodes of other components formed on the substrate, so as to compensate for at least one of the modification of impedance resulting from the conducting fingers being parallel to each other and the modification of impedance resulting from several components in parallel on said substrate.

10. The semiconductor component of claim 1, further comprising circuits for pre-adaptation of the output impedance, formed by a combination of inductive sections and capacitive sections of conductors connecting conducting regions constituting the upper electrode as well as a combination of inductive sections and capacative sections of conductors interconnecting upper electrodes of other components formed on the substrate, so as to compensate for at least one of the modification of impedance resulting from the conducting regions being parallel to each other and the modification of impedance resulting from several components in parallel on said substrate.

* * * * *